(12) United States Patent
Wang et al.

(10) Patent No.: US 8,580,094 B2
(45) Date of Patent: Nov. 12, 2013

(54) MAGNETRON DESIGN FOR RF/DC PHYSICAL VAPOR DEPOSITION

(75) Inventors: Rongjun Wang, Dublin, CA (US); Sally Lou, Santa Clara, CA (US); Muhammad Rasheed, San Jose, CA (US); Jianxin Lei, Sunnyvale, CA (US); Xianmin Tang, San Jose, CA (US); Srinivas Gandikota, Santa Clara, CA (US); Ryan Hanson, Palo Alto, CA (US); Tza-Jing Gung, San Jose, CA (US); Keith A. Miller, Mountain View, CA (US); Thanh X. Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 101 days.

(21) Appl. No.: 13/163,817

(22) Filed: Jun. 20, 2011

(65) Prior Publication Data
US 2011/0311735 A1   Dec. 22, 2011

Related U.S. Application Data

(60) Provisional application No. 61/357,056, filed on Jun. 21, 2010.

(51) Int. Cl.
*C23C 14/35* (2006.01)

(52) U.S. Cl.
USPC .................. 204/298.19; 204/298.2

(58) Field of Classification Search
USPC .......................... 204/298.19, 298.2
See application file for complete search history.

(56) References Cited

U.S. PATENT DOCUMENTS

| | | | | |
|---|---|---|---|---|
| 5,374,343 A | * | 12/1994 | Sasaki et al. | 204/298.2 |
| 5,415,754 A | * | 5/1995 | Manley | 204/192.12 |
| 6,132,576 A | * | 10/2000 | Pearson | 204/298.2 |
| 6,440,282 B1 | * | 8/2002 | Wada et al. | 204/298.2 |
| 2012/0024229 A1 | | 2/2012 | Liu et al. | |
| 2012/0027954 A1 | | 2/2012 | Liu et al. | |

FOREIGN PATENT DOCUMENTS

JP   01-279752   * 11/1989

* cited by examiner

*Primary Examiner* — Rodney McDonald
(74) *Attorney, Agent, or Firm* — Moser Taboada; Alan Taboada

(57) ABSTRACT

Methods and apparatus to improve target life and deposition uniformity in PVD chambers are provided herein. In some embodiments, a magnetron assembly includes a shunt plate having a central axis, the shunt plate rotatable about the central axis, a first open loop magnetic pole arc coupled to the shunt plate at a first radius from the central axis, and a second open loop magnetic pole arc coupled the shunt plate at a first distance from the first open loop magnetic pole arc, wherein at least one of the first radius varies along the first open loop magnetic pole arc or the first distance varies along the second open loop magnetic pole arc. In some embodiments, a first polarity of the first open loop magnetic pole arc opposes a second polarity of the second open loop magnetic pole arc.

15 Claims, 4 Drawing Sheets

MAGNETRON DESIGN FOR RF/DC PHYSICAL VAPOR DEPOSITION

CROSS-REFERENCE TO RELATED APPLICATIONS

This application claims benefit of U.S. provisional patent application Ser. No. 61/357,056, filed Jun. 21, 2010, which is herein incorporated by reference.

FIELD

Embodiments of the present invention generally relate to magnetrons for use in physical vapor deposition (PVD) chambers.

BACKGROUND

High pressure radio frequency/direct current (RF/DC) PVD processes can be used for metal gate, salicide, and contact applications. For example, benefits of using RF/DC PVD can include improved bottom coverage inside a trench or via structure than conventional DC PVD processes. Ring type magnetron or variable-radius ring magnetron (VRAM) designs can be used for RF/DC PVD due to their simplicity of design and ability to provide better bottom coverage than DC magnetrons. However, despite improved bottom coverage, target utilization for DC/RF magnetrons is poor. Thus, even though most of the target material has not been used, the target life is short. Targets including ferromagnetic materials, such as iron (Fe), nickel (Ni), cobalt (Co) and their alloys may have especially short target lives.

Further, RF/DC magnetrons may facilitate process drift over the target lifetime due to uneven wear of the target. For example, as the target erodes, RF energy may be distributed more into a track formed in the target and less into other areas of the target which causes the deposition profile on the wafer to change. For example, if the track is on the target edge, the deposition on the edge of the wafer will increase at a greater rate than other areas of the wafer as the target erodes, resulting in an edge high thickness profile on the wafer.

Further, although some DC magnetrons allow for two or more tracks to form in the target during target erosion from PVD processes, the closed magnetic loop confines the plasma closely near the target and plasma volume inside the chamber is small. As such, metal atoms sputtered from the target have a lower probability of being ionized resulting in reduced bottom coverage.

Therefore, the inventors have provided improved magnetron designs for use in RF/DC PVD processes.

SUMMARY

Embodiments of the present invention relate to magnetron designs for use in radio frequency (RF) PVD processes. The magnetron is designed to increase target life, improve uniformity, provide required step coverage, and be used with RF and DC power applied to a target disposed in the PVD chamber.

In some embodiments, a magnetron may have an inner pole arc and an outer pole arc having opposite polarities and varying radii relative to the center of the magnetron, but with constant distance between the inner and outer pole arcs. The magnetron may also have auxiliary pole pieces of opposite polarity (with respect to each other) which are separate from the inner and outer pole arcs. The magnetron's inner and outer poles form an open loop magnetic field. The varying radii of the inner and outer poles relative to the center of the magnetron increase the length of the target life by widening the target erosion track. The auxiliary pole pieces improve the uniformity and step coverage of the deposition on the substrate. The open loop magnetic field formed by the inner and outer poles improves step coverage.

In some embodiments, different arc segments of magnets with different radius and similar N to S distance between the arcs may be closed packed to maintain plasma continuity. The magnetic strength may be balanced so that each erosion track formed in a target during use has a similar erosion rate. In embodiments where the distance between the N to S (inner and outer arc segments) is varied, the location of erosion track is also varied, thereby enhancing target usage and lifetime. The arrangement of the arc segments may also be configured to enhance plasma continuity.

In some embodiments, a magnetron assembly may include a shunt plate having a central axis, the shunt plate rotatable about the central axis, a first open loop magnetic pole arc coupled to the shunt plate at a first radius from the central axis, and a second open loop magnetic pole arc coupled the shunt plate at a first distance from the first open loop magnetic pole arc, wherein at least one of the first radius varies along the first open loop magnetic pole arc or the first distance varies along the second open loop magnetic pole arc. In some embodiments, a first polarity of the first open loop magnetic pole arc opposes a second polarity of the second open loop magnetic pole arc.

In some embodiments, a method of processing a substrate in a physical vapor deposition (PVD) chamber includes applying a first RF power at a VHF frequency to a target comprising a metal disposed above the substrate to form a plasma from a plasma-forming gas, applying DC power to the target to direct the plasma towards the target, rotating a magnetron above the target while directing the plasma towards the target, the magnetron having a first open loop magnetic pole arc disposed at a first radius from a central axis of the magnetron and a second open loop magnetic pole arc disposed at a first distance from the first magnetic pole arc, wherein at least one of the first radius varies along the first open loop magnetic pole arc or the second distance varies along the second open loop magnetic pole arc, sputtering metal atoms from the target using the plasma while maintaining a first pressure in the PVD chamber sufficient to ionize a predominant portion of the metal atoms sputtered from the target, and depositing the ionized metal atoms on the substrate to form a layer thereon.

In some embodiments, the method further includes providing a plurality of substrates to the PVD chamber, where each substrate in the plurality of substrates is sequentially provided to the PVD chamber to form a layer on the substrate. The magnetron may facilitate a sputtering distribution of metal atoms from the target such that a initial profile of a initial layer formed on an initial substrate in the plurality of substrates is substantially equivalent to a final profile of a final layer formed on a final substrate in the plurality of substrates to be processed in the PVD chamber.

The configurations shown in any of the embodiments disclosed herein can be combined to the extend not inconsistent with each other. Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1A:
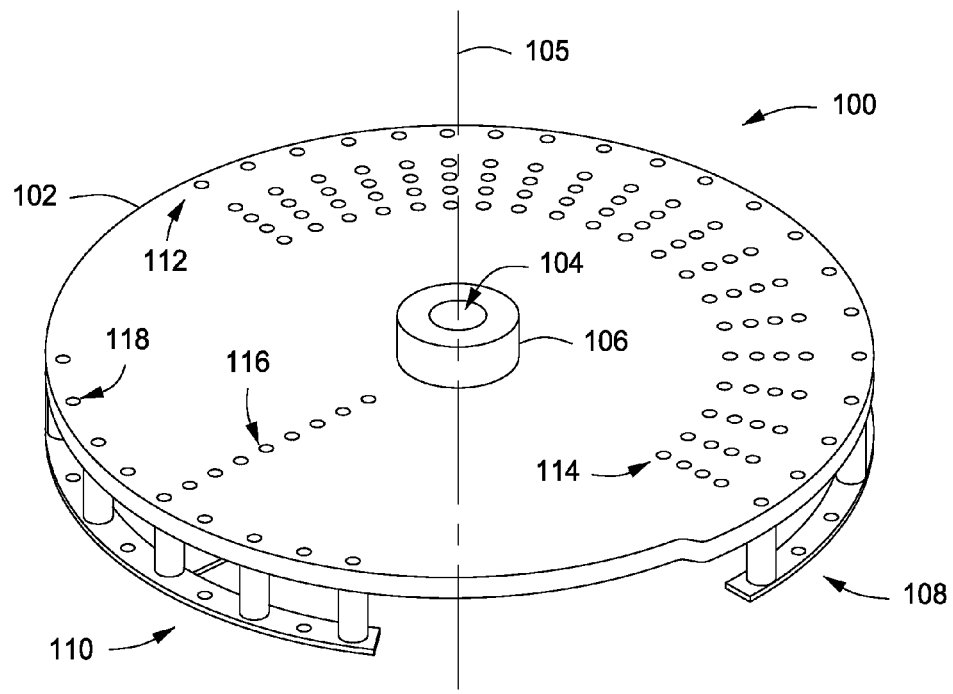
FIGS. 1A-C depict perspective and bottom views of a magnetron in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention relate to magnetron designs for use in radio frequency (RF) physical vapor deposition (PVD) processes and methods of use thereof. Embodiments of the inventive magnetron may advantageously increase target life, improve deposition uniformity, and provide required step coverage for processes performed in an RF/DC PVD chamber.

The magnetrons of the present invention may generally be used in PVD chambers having RF, and optionally DC, power applied to the target of the PVD chamber. Non-limiting examples of processes that may benefit from utilization of the present inventive magnetron include titanium nitride deposition and nickel platinum deposition, amongst other deposition processes.

Each of the inventive magnetron designs discussed herein include two arcs of magnets that are spaced apart from each other by a distance, d. Each arc may comprise a plurality of magnets arranged to form the arc. The magnets may be provided in size and number as desired to provide a particular strength magnetic field. Respective pole pieces may be disposed over each of the pluralities of magnets to provide a continuous arc shape. The pole pieces may be fabricated from a ferromagnetic material, such as in a non-limiting example, 400-series stainless steel or other suitable materials. The arcs may range in length from about 20 degrees to about 240 degrees, or from about 90 to about 180 degrees, or from about 120 to about 180 degrees. In some embodiments, each arc may be segmented into a plurality of smaller arc segments. In some embodiments, the segments in each arc may be similarly sized and grouped together. In some embodiments, the segments in each arc may be differently sized.

The distance between the two arcs can be constant, or may vary (continuously or discontinuously) along the length of the arcs. In some embodiments, the distance between the arcs may range from about 0.5 to about 4 inches.

The magnetic strength of the two arcs may be the same or different. The polarity within a given arc may be the same (e.g., north or south), but the polarity between arcs should be opposite (e.g., inner north and outer south or inner south and outer north).

Optionally, auxiliary magnets may be provided in a spaced apart relation from the pair of arcs. In some embodiments, a pair of auxiliary magnets may be provided in a pair In some embodiments, for example, in a magnetron designed for 300 mm substrate processing, the inner of the two arcs may be disposed from about zero to about 8 inches from a center of rotation of the magnetron.

For example, in some embodiments, the magnetron may have an inner pole arc and an outer pole arc having opposite polarities and varying radii relative to the center of the magnetron, but with constant distance between the inner and outer pole arcs. The magnetron may also have two auxiliary pole pieces of opposite polarity (with respect to each other) which are separate from the inner and outer pole arcs. The magnetron's inner and outer poles form an open loop magnetic field. The varying radii of the inner and outer poles relative to the center of the magnetron increase the length of the target life by widening the target erosion track. The auxiliary pole pieces improve the uniformity and step coverage of the deposition on the substrate. The open loop magnetic field formed by the inner and outer poles improves step coverage.

Figure 1B:
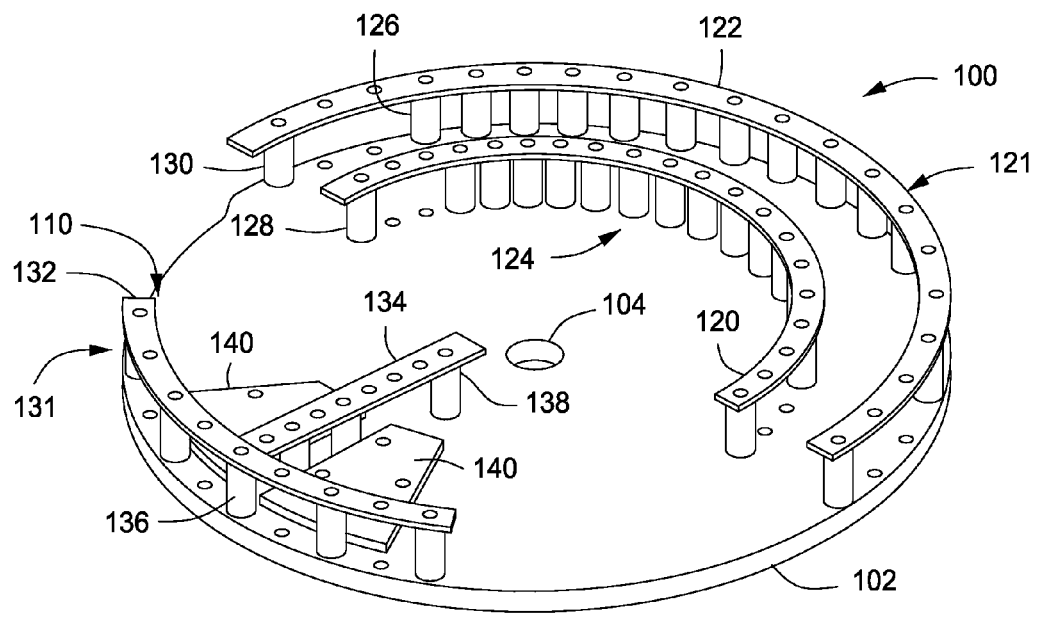
Figure 1C:
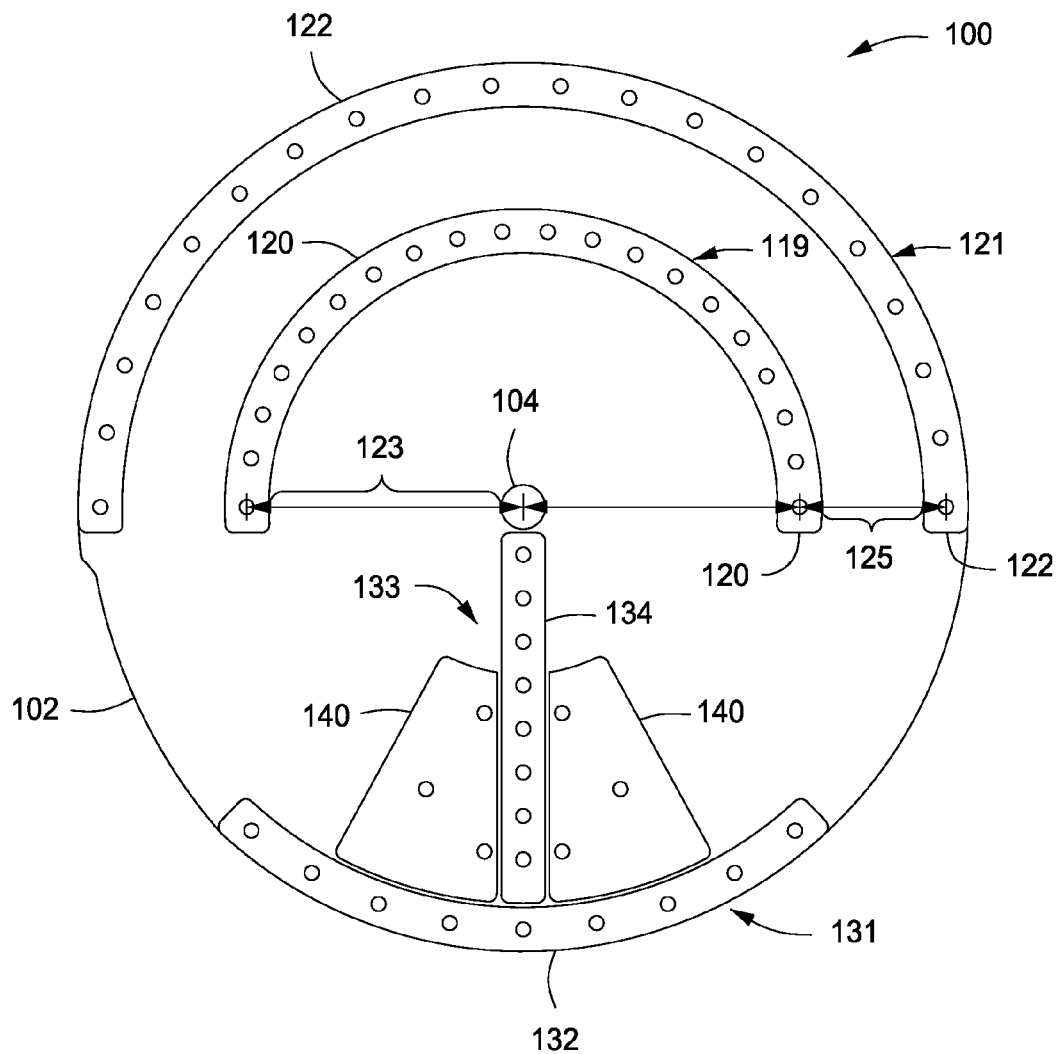
Figure 3:
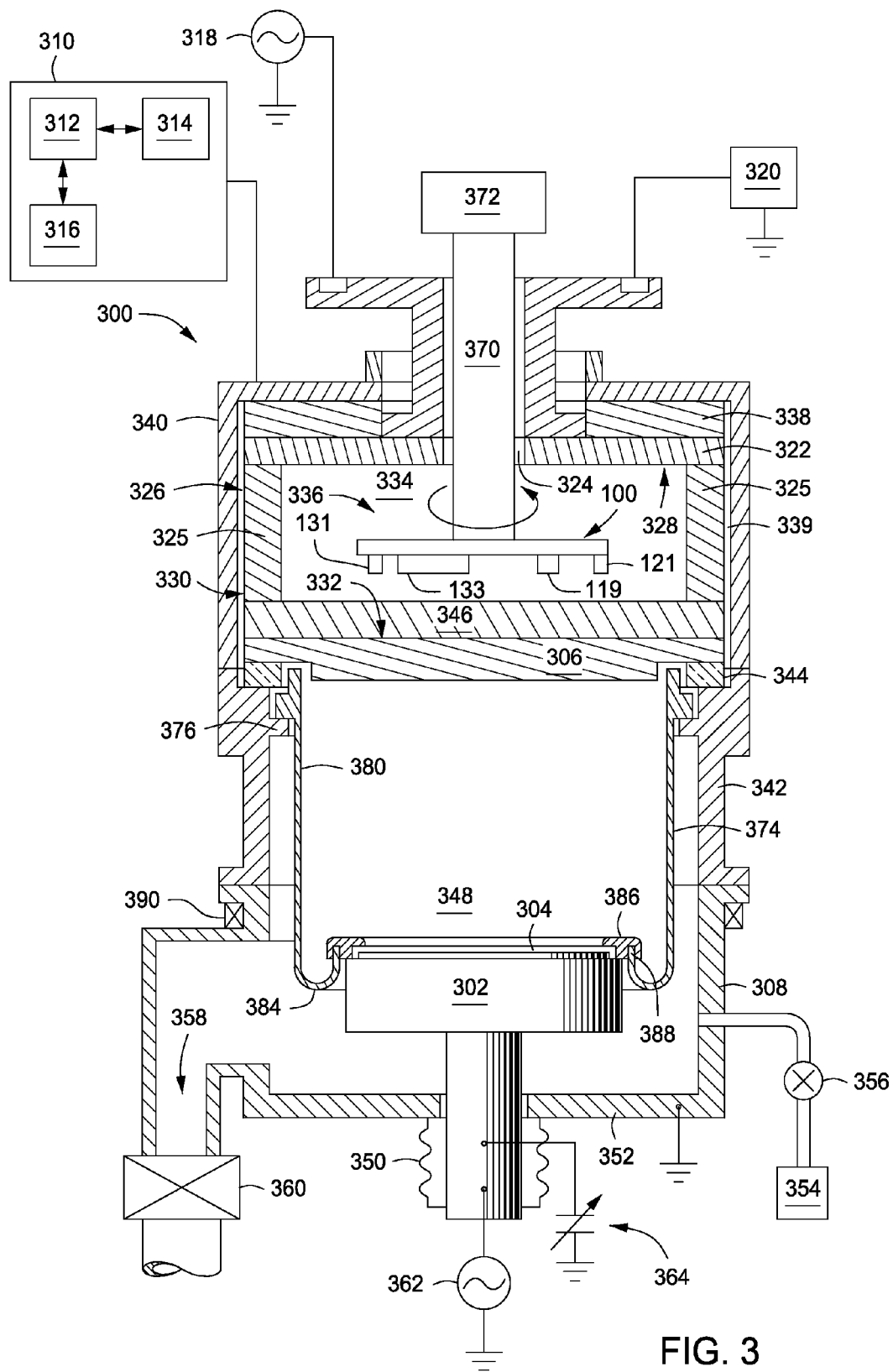
FIG. 3 depicts a physical vapor deposition chamber in accordance with some embodiments of the present invention.

For example, FIGS. 1A-C depict a top and bottom perspective views (FIGS. 1A-B) and a bottom view (FIG. 1C) of a magnetron 100 in accordance with some embodiments of the present invention. The magnetron 100 includes a shunt plate 102 which also serves as a structural base for the magnetron assembly. The shunt plate 102 may include a central opening 104 and a mounting plate 106 for mounting the shunt plate to a shaft to provide rotation of the magnetron 100 during use, for example, such as a rotation shaft 370 as shown in FIG. 3 and discussed below. A pair of open loop magnetic poles 108 and, optionally auxiliary open loop magnetic poles 110, are coupled to the shunt plate. The poles may be coupled to the shunt plate, for example, via a plurality of mounting holes (e.g., 112, 114, 116, 118 shown in FIG. 1A).

The pair of open loop magnetic poles 108 may include a first open loop magnetic pole arc 119 and a second open loop magnetic pole arc 121 disposed about a central axis 105 of the shunt plate 102. For example, as shown in FIG. 1C, the first open loop magnetic pole arc 119 may be may be coupled to the shunt plate 102 at a first radius 123 from the central axis 105. In some embodiments, for example, in a magnetron designed for 300 mm substrate processing, the first radius arcs may range from about zero to about 8 inches from the central axis 105 of the shunt plate 102. In some embodiments, the first radius 123 may vary about the central axis 105. For example, (not shown), the first open loop magnetic pole arc 119 may be off-centered with respect to the central axis of the shunt plate 102. The first open loop magnetic pole arc 119 may be, for example, an inner arc as shown in FIG. 1B-C. The first open loop magnetic pole arc 119 may include a first pole piece 120, which is formed in the shape of an arc, and a plurality of magnets 124 disposed between the first pole piece 120 and the shunt plate 102. As illustrated in FIGS. 1A-B, the plurality of magnets 124 does not need to be distributed along the entire length of the pole piece 120. For example, the number and/or distribution of magnets 124 about the length of the first pole piece 120 may be adjusted to change magnetic field strength and/or facilitate improved target lifetime and/or deposition uniformity. In embodiments, where the plurality of magnets 124 are not distributed along the entire length of the first pole piece 120, one or more spacers 128 may be provided to support the ends of the first pole piece 120.

The second open loop magnetic pole arc 121 may be coupled to the shunt plate 102 at a first distance 125 from the first open loop magnetic pole arc 119 as shown in FIG. 1C. In some embodiments, at least one of the first radius 123 varies along the first open loop magnetic pole arc 119 or the first distance 125 varies along the second open loop magnetic pole arc 121. For example, the first distance may vary if the second open loop magnetic pole arc 121 remains centered about the central axis 105 of the shunt plate 102 and the first radius 123 varies about the central axis 105. Alternatively, the first radius 123 may be constant about the central axis 105 and the second open loop magnetic pole arc 121 may be off-centered about the central axis 105 (not shown) such that the first distance varies along the second open loop magnetic pole arc 121. In yet another alternative embodiment, the first radius 123 and the first distance 125 may vary due to both the first and second open loop magnetic pole arcs 119, 121 being off-centered about the central axis 105. In some embodiments, the first distance 125 may range from about 0.5 to about 4 inches.

An outer arc may be formed by a pole arc 122 and a plurality of magnets 126. As illustratively shown in FIGS. 1 and 2, the pluralities of magnets in each pole do not need to be distributed along the entire arc. In such embodiments, spacers 130, 128, may be provided to support the ends of the poles. The second open loop magnetic pole arc 121 may be, for example, an outer arc as shown in FIG. 1B-C. The second open loop magnetic pole arc 121 may include a second pole piece 122, which is formed in the shape of an arc, and a plurality of magnets 126 disposed between the second pole piece 122 and the shunt plate 102. As illustrated in FIGS. 1A-B, the plurality of magnets 126 does not need to be distributed along the entire length of the second pole piece 122. For example, the number and/or distribution of magnets 126 about the length of the second pole piece 122 may be adjusted to change magnetic field strength and/or facilitate improved target lifetime and/or deposition uniformity. In embodiments, where the plurality of magnets 126 are not distributed along the entire length of the second pole piece 122, one or more spacers 130 may be provided to support the ends of the second pole piece 122.

Generally, the first and second pole pieces 120, 122 may be fabricated from a ferromagnetic material, such as in a non-limiting example, 400-series stainless steel or other suitable materials. The arc lengths of each of the first and second pole pieces 120, 122 may range in arc length from about 20 degrees to about 240 degrees, or from about 90 to about 180 degrees, or from about 120 to about 180 degrees. The magnetic strength of the each of the first and second open loop magnetic pole arcs 119, 121 may be the same or different. The polarity within a each arc may be the same (e.g., north or south), but the polarity between arcs may be opposite (e.g., inner north and outer south or inner south and outer north). In some embodiments, a first polarity of the first open loop magnetic pole arc 119 opposes a second polarity of the second open loop magnetic pole arc 121.

Optionally, the magnetron 100 may include an auxiliary magnetic pole assembly 110 as shown in FIGS. 1B-C, for example, to adjust a shape and/or strength of the overall magnetic field of the magnetron 100, to counterbalance the weight of the first and second open loop magnetic pole arcs 119, 121, or the like.

In some embodiments, the auxiliary magnetic pole assembly 110 may include a third open loop magnetic pole arc 131 coupled to the shunt plate 102 and opposing the first and second open loop magnetic pole arcs 119, 121. As shown in FIG. 1B, the third open loop magnetic pole arc 131 may include a third pole piece 132 and a plurality of magnets 136 disposed between the third pole piece 132 and the shunt plate 102. Similar to the first and second open loop magnetic pole arcs 119, 121 discussed above, the plurality of magnets 136 need not span the entire arc length of the third pole piece 132 and may be distributed in any suitable arrangement to adjust overall magnetic field strength and/or magnetic field shape of the magnetron 100.

Alternatively or in combination, the auxiliary magnetic pole assembly may include linear stem open loop magnetic pole 133 coupled to the shunt plate 102 and extending from the third open loop magnetic pole arc 131 towards the central axis 105 of the shunt plate 102. The linear stem open loop magnetic pole 133 may include a linear pole piece 134 and a plurality of magnets 138 disposed between the linear pole piece 134 and the shunt plate 102. Similar to the magnet pole arcs discussed above, the plurality of magnets 138 need not span the entire length of the linear pole piece 134 and may be distributed in any suitable arrangement to adjust overall magnetic field strength and/or magnetic field shape of the magnetron 100. In some embodiments, a polarity of the third open loop magnetic pole arc 131 may oppose a polarity of the linear stem magnetic pole 133.

The auxiliary magnetic pole assembly 110 may include one or more counterweights 140, for example to radially balance the mass of the magnetron 100. In some embodiments, a counterweight 140 may be disposed on each side of the linear stem magnetic pole 133 as shown in FIGS. 1B-C.

Providing auxiliary magnets that are not as closely paired together as the magnets in the first and second arcs, the magnetic field may extend deeper into the chamber. Whether the magnetic field drives the electrons and ions (both argon ions and metal ions) towards the substrate center, the substrate edge, or the shield, may be controlled by the polarity of the linear stem magnetic pole 133 relative to the polarity of the first arc and the strength of the magnetic field. For example, if the linear stem magnetic pole 133 has a different polarity than the first arc, the ions may be driven to the substrate center, and enhance the deposition rate on the substrate center. If the linear stem magnetic pole 133 has the same polarity as first arc, the ions may be driven out of the substrate center which could enhance the deposition rate on the substrate edge. In such a way, an auxiliary magnet can be used to adjust the deposition profile on the substrate. Because the auxiliary magnet can be arranged to drive the ions towards the substrate center, the step-coverage of an inside a structure may be improved as the metal ion to neutral ratio increases. An auxiliary magnet may also facilitate RF sputtering in a central portion of the target, which helps facilitate full face erosion of the target (e.g., more uniform erosion of the target).

Figure 2A:
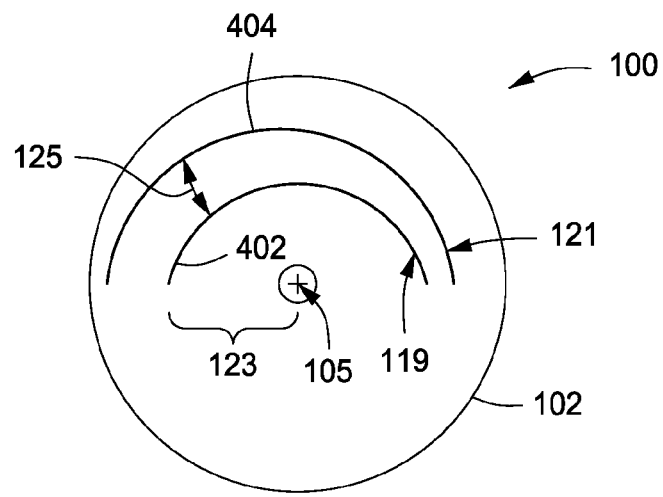
FIGS. 2A-C depict partial schematic bottom views of magnetrons in accordance with some embodiments of the present invention.
Figure 2B:
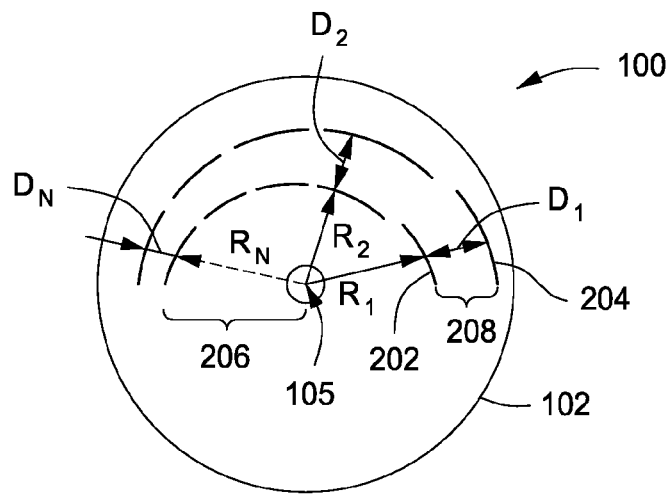
Figure 2C:
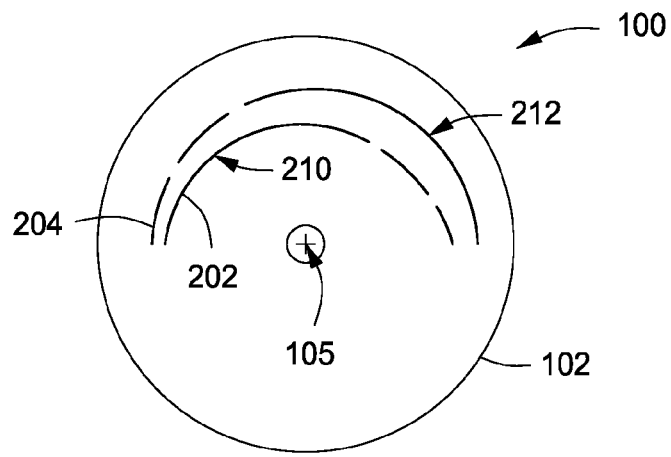

FIGS. 2A-C depict partial schematic bottom views of magnetrons in accordance with some embodiments of the present invention. Optional elements, such as the auxiliary magnetic pole assembly 110, may be included with the configurations of the magnetron shown in FIGS. 2A-C, although such optional elements are not explicitly show in FIGS. 2A-C.

For example, FIG. 2A depicts a configuration of the first and second open loop magnetic poles 119, 121 as discussed above. As shown in FIG. 2A, in some embodiments, the first radius 123 is constant along the first open loop magnetic pole arc 119 and the first distance 125 varies along the second open loop magnetic pole arc 121. As discussed above, the second distance may vary due to the second open loop magnetic pole arc 121 being off-centered with respect to the first open loop magnetic pole arc 119 as shown in FIG. 2A. Alternatively, in some embodiments, the second open loop magnetic pole arc 121 may have arc shape having a varying diameter which can cause the second distance 125 to vary along the second open loop magnetic pole arc 121.

FIGS. 2B-C depicts a configuration of the magnetron where the first and second open loop magnetic poles 119, 121 may further include a plurality of first open loop magnetic pole arcs 202 and a plurality of second open loop magnetic pole arcs 204. Although each first or second open loop magnetic pole 202, 204 is draw as being immediately radially adjacent to a neighboring first or second open loop magnetic pole 202, 204, in some embodiments there may be a gap (not shown) between adjacent first or second open loop magnetic poles 202, 204. Each first open loop magnetic pole arc 202 may be disposed at one of a plurality of first radii 206 from the central axis 105 of the shunt plate 102 as depicted in FIG. 2B. In some embodiments, such as shown in FIG. 2B, similarly sized first and second open loop magnetic pole arcs 202, 204 may be paired. However, and alternatively as shown in FIG. 2C, similarly sized first and second open loop magnetic pole arcs 202, 204 need not necessarily be paired.

Each first open loop magnetic pole arc 202 may include one or more magnetic disposed between a pole piece and the shunt plate 102 (not shown), similar to embodiments of the pole piece 120 and plurality of magnets 124 as discussed above for the first open loop magnetic pole arc 119.

Each second open loop magnetic pole arc 204 may be disposed at one of a plurality of first distances 208 from a respective one of the plurality of first open loop magnetic pole arcs 202 as shown in FIG. 2B. Similar to embodiments discussed above for the first and second open loop magnetic poles 119, 121, in some embodiments, at least one of each of the plurality of first radii 206 may have the same value or each of the plurality of first distances 208 may have the same value.

However, in some embodiments, at least one of one or more first radii 206 may have different values or one or more first distances 208 may have different values. As illustrated in FIG. 2B, there may be N number of first open loop magnetic pole arcs 202 having N first radii 206 and N number of second open loop magnetic pole arcs 204 having N second distances 208. For example, in some embodiments, at least two of the first radii 206, for example first radii R1 and R2, are not equal. However, in some embodiments, each first distance, for example first distances D1 and D2 that extend from the first open loop magnetic poles 206 having the unequal first radii R1 and R2 respectively to second open loop magnetic poles 208, may be equal. Alternatively, and not shown, in some embodiments, each first radii 206 may be equal and at least two first distances 208 may not be equal. In yet another alternative embodiment, at least two first radii 206 and at least two first distances 208 may not be equal. The first radii 206 and the first distance 208 may be varied in any suitable manner to adjust the shape and/or strength of the magnitude field formed by the magnetron 100 to facilitate deposition uniformity and/or improved target wear as discussed above.

FIG. 2C depicts a configuration of the magnetron 100 wherein an arc length of one or more first open loop magnetic pole arcs 202 and/or an arc length of one or more second open loop magnetic pole arcs 204 may be varied. For example, as shown in FIG. 2C, one of the plurality of first open loop magnetic pole arcs 202 has an arc length 210 that spans more than one of the plurality of second open loop magnetic pole arcs 204. Similarly, one of the plurality of second open loop magnetic pole arcs 204 has an arc length 2123 that spans more than one of the plurality of first open loop magnetic pole arcs 202. However, the embodiment shown in FIG. 2C is merely exemplary, and other configurations are possible, for example (not shown) each arc length 210, 212 need not span multiple open loop magnetic poles as shown in FIG. 2C. For example, the first and second open loop magnetic poles having the arc lengths 210, 212 may be paired with corresponding second and first open loop magnetic poles, respectively, having the same arc length (not shown). Further, the number of first open loop magnetic pole arcs 202 need not equal the number of second open loop magnetic pole arcs 204 as illustrated in FIG. 2C. In some embodiments, the arc lengths of at least two first open loop magnetic pole arcs 202 are not equal. Similarly, in some embodiments, the arc lengths of at least two second open loop magnetic poles are not equal.

The embodiments discussed above in FIGS. 2B-C may provide one or more benefits. For example, first open loop magnetic pole arcs 202 having different first radii 206 and corresponding second open loop magnetic pole arcs 204 having similar first distances 208 may be closed packed to maintain plasma continuity. The magnetic strength of the one or more of the first and second open loop magnetic pole arcs 202, 204 may be balanced so that each erosion track formed in a target during use has a similar erosion rate. In some embodiments, where the first distances 208 are varied, the location of erosion track may also be varied, thereby enhancing target usage and lifetime. In some embodiments, the arrangement of the first and second open loop magnetic arcs 202, 204 may be configured to enhance plasma continuity. Aspects of the magnetron discussed in FIGS. 2B-C, as well as any aspects of a magnetron disclosed herein, can be combined to provide any or all of the benefits discussed herein. For example, the magnetic strength of each segment (including a pair of first arcs or second arcs) can be adjusted so that the erosion rate in each erosion track can be adjusted independently. In addition, the location of each erosion track and the width of each erosion can also be adjusted by adjusting the location of the first arc and distance between the first arc and second arc. By controlling these parameters, the deposition profile on the substrate can be controlled. The erosion locations and erosion widths on the target can also be controlled so that all erosion tracks are very closely spaced together, and as a result, a large erosion band can be formed. The large erosion band can be eroded evenly over the whole target life thereby significantly increasing the target life.

FIG. 3 depicts a schematic, cross-sectional view of a physical vapor deposition chamber (process chamber 300) in accordance with some embodiments of the present invention. Examples of suitable PVD chambers include the ALPS® Plus and SIP ENCORE® PVD process chambers, both commercially available from Applied Materials, Inc., of Santa Clara, Calif. Other process chambers from Applied Materials, Inc. or other manufactures may also benefit from the inventive apparatus disclosed herein.

The process chamber 300 contains a substrate support pedestal 302 for receiving a substrate 304 thereon, and a sputtering source, such as a target 306. The substrate support pedestal 302 may be located within a grounded enclosure wall 308, which may be a chamber wall (as shown) or a grounded shield (a ground shield 340 is shown covering at least some portions of the chamber 300 above the target 306. In some embodiments, the ground shield 340 could be extended below the target to enclose the pedestal 302 as well).

In some embodiments, the process chamber includes a feed structure for coupling RF and DC energy to the target 306. The feed structure is an apparatus for coupling RF and DC energy to the target, or to an assembly containing the target, for example, as described herein. A first end of the feed structure can be coupled to an RF power source 318 and a DC power source 320, which can be respectively utilized to provide RF and DC energy to the target 306. For example, the DC power source 320 may be utilized to apply a negative voltage, or bias, to the target 306. In some embodiments, RF energy supplied by the RF power source 318 may range in frequency from about 2 MHz to about 60 MHz, or, for example, non-limiting frequencies such as 2 MHz, 13.56 MHz, 27.12 MHz, 40.68 MHz or 60 MHz can be used. In some embodiments, a plurality of RF power sources may be provided (i.e., two or more) to provide RF energy in a plurality of the above frequencies. The feed structure may be fabricated from suitable conductive materials to conduct the RF and DC energy from the RF power source 318 and the DC power source 320.

In some embodiments, the feed structure may have a suitable length that facilitates substantially uniform distribution of the respective RF and DC energy about the perimeter of the feed structure. For example, in some embodiments, the feed structure may have a length of between about 1 to about 12 inches, or about 4 inches. In some embodiments, the body may have a length to inner diameter ratio of at least about 1:1. Providing a ratio of at least 1:1 or longer provides for more uniform RF delivery from the feed structure (i.e., the RF energy is more uniformly distributed about the feed structure to approximate RF coupling to the true center point of the feed structure. The inner diameter of the feed structure may be as small as possible, for example, from about 1 inch to about 6 inches, or about 4 inches in diameter. Providing a smaller inner diameter facilitates improving the length to ID ratio without increasing the length of the feed structure.

The second end of the feed structure may be coupled to a source distribution plate 322. The source distribution plate includes a hole 324 disposed through the source distribution plate 322 and aligned with a central opening of the feed structure. The source distribution plate 322 may be fabricated from suitable conductive materials to conduct the RF and DC energy from the feed structure.

The source distribution plate 322 may be coupled to the target 306 via a conductive member 325. The conductive member 125 may be a tubular member having a first end 326 coupled to a target-facing surface 328 of the source distribution plate 322 proximate the peripheral edge of the source distribution plate 322. The conductive member 325 further includes a second end 330 coupled to a source distribution plate-facing surface 332 of the target 306 (or to the backing plate 346 of the target 306) proximate the peripheral edge of the target 306.

A cavity 334 may be defined by the inner-facing walls of the conductive member 325, the target-facing surface 328 of the source distribution plate 322 and the source distribution plate-facing surface 332 of the target 306. The cavity 334 is fluidly coupled to the central opening 315 of the body via the hole 324 of the source distribution plate 322. The cavity 334 and the central opening 315 of the body may be utilized to at least partially house one or more portions of a rotatable magnetron assembly 336 as illustrated in FIG. 3 and described further below. In some embodiments, the cavity may be at least partially filled with a cooling fluid, such as water ($H_2O$) or the like.

A ground shield 340 may be provided to cover the outside surfaces of the lid of the process chamber 300. The ground shield 340 may be coupled to ground, for example, via the ground connection of the chamber body. The ground shield 340 has a central opening to allow the feed structure to pass through the ground shield 340 to be coupled to the source distribution plate 322. The ground shield 340 may comprise any suitable conductive material, such as aluminum, copper, or the like. An insulative gap 339 is provided between the ground shield 340 and the outer surfaces of the distribution plate 322, the conductive member 325, and the target 306 (and/or backing plate 346) to prevent the RF and DC energy from being routed directly to ground. The insulative gap may be filled with air or some other suitable dielectric material, such as a ceramic, a plastic, or the like.

In some embodiments, a ground collar may be disposed about the body and lower portion of the feed structure. The ground collar is coupled to the ground shield 340 and may be an integral part of the ground shield 340 or a separate part coupled to the ground shield to provide grounding of the feed structure. The ground collar 340 may be made from a suitable conductive material, such as aluminum or copper. In some embodiments, a gap disposed between the inner diameter of the ground collar and the outer diameter of the body of the feed structure may be kept to a minimum and be just enough to provide electrical isolation. The gap can be filled with isolating material like plastic or ceramic or can be an air gap. The ground collar prevents cross-talk between the RF feed (e.g., electrical feed 205, discussed below) and the body, thereby improving plasma, and processing, uniformity.

An isolator plate 338 may be disposed between the source distribution plate 322 and the ground shield 340 to prevent the RF and DC energy from being routed directly to ground. The isolator plate 338 has a central opening to allow the feed structure to pass through the isolator plate 338 and be coupled to the source distribution plate 322. The isolator plate 338 may comprise a suitable dielectric material, such as a ceramic, a plastic, or the like. Alternatively, an air gap may be provided in place of the isolator plate 338. In embodiments where an air gap is provided in place of the isolator plate, the ground shield 340 may be structurally sound enough to support any components resting upon the ground shield 340.

The target 306 may be supported on a grounded conductive aluminum adapter 342 through a dielectric isolator 344. The target 306 comprises a material to be deposited on the substrate 304 during sputtering, such a metal or metal oxide. In some embodiments, the backing plate 346 may be coupled to the source distribution plate-facing surface 332 of the target 306. The backing plate 346 may comprise a conductive material, such as copper-zinc, copper-chrome, or the same material as the target, such that RF and DC power can be coupled to the target 306 via the backing plate 346. Alternatively, the backing plate 346 may be non-conductive and may include conductive elements (not shown) such as electrical feedthroughs or the like for coupling the source distribution plate-facing surface 332 of the target 306 to the second end 330 of the conductive member 325. The backing plate 346 may be included for example, to improve structural stability of the target 306.

The substrate support pedestal 302 has a material-receiving surface facing the principal surface of the target 306 and supports the substrate 304 to be sputter coated in planar position opposite to the principal surface of the target 306. The substrate support pedestal 302 may support the substrate 304 in a central region 348 of the process chamber 300. The central region 348 is defined as the region above the substrate support pedestal 302 during processing (for example, between the target 306 and the substrate support pedestal 302 when in a processing position).

In some embodiments, the substrate support pedestal 302 may be vertically movable through a bellows 350 connected to a bottom chamber wall 352 to allow the substrate 304 to be transferred onto the substrate support pedestal 302 through a load lock valve (not shown) in the lower portion of processing the chamber 300 and thereafter raised to a deposition, or processing position. One or more processing gases may be supplied from a gas source 354 through a mass flow controller 356 into the lower part of the chamber 300. An exhaust port 158 may be provided and coupled to a pump (not shown) via a valve 360 for exhausting the interior of the process chamber 300 and facilitating maintaining a desired pressure inside the process chamber 300.

An RF bias power source 362 may be coupled to the substrate support pedestal 302 in order to induce a negative DC bias on the substrate 304. In addition, in some embodiments, a negative DC self-bias may form on the substrate 304 during processing. For example, RF power supplied by the RF bias power source 362 may range in frequency from about 2 MHz to about 60 MHz, for example, non-limiting frequencies such as 2 MHz, 13.56 MHz, or 60 MHz can be used. Optionally, a second RF bias power source (not shown) may be coupled to the substrate support pedestal 302 and provide any of the frequencies discussed above for use with the RF bias power source 362. In other applications, the substrate support pedestal 302 may be grounded or left electrically floating. For example, a capacitance tuner 364 may be coupled to the substrate support pedestal for adjusting voltage on the substrate 304 for applications where RF bias power may not be desired. In some embodiments, the capacitance tuner 364 may be used to adjust the substrate floating potential so that ion energy arriving at the substrate can be controlled.

A rotatable magnetron assembly 336 may be positioned proximate a back surface (e.g., source distribution plate-facing surface 332) of the target 306. The rotatable magnetron assembly 336 includes the magnetron 100 connects to a rotation shaft 370 coincident with the central axis of the chamber 300 and the substrate 304. For example, the magnetron 100 may be coupled to the rotation shaft 370 at the central opening 104 via the mounting plate 106. A motor 372 can be coupled to the upper end of the rotation shaft 370 to drive rotation of the magnetron assembly 336. The magnets 124, 126, 136, and/or 138 produce a magnetic field within the chamber 300, generally parallel and close to the surface of the target 306 to trap electrons and increase the local plasma density, which in turn increases the sputtering rate. The magnets 124, 126, 136, and/or 138 produce an electromagnetic field around the top of the chamber 300, and the magnets are rotated to rotate the electromagnetic field which influences the plasma density of the process to more uniformly sputter the target 306. For example, the rotation shaft 370 may make about 0 to about 150 rotations per minute. Embodiments of the magnetron 100 illustrated in FIGS. 1A-C are shown in combination with the chamber 300, however, any embodiments of a magnetron disclosed herein may be utilized in combination with the chamber 300 and the methods described below for processing the substrate 304.

In some embodiments, the chamber 300 may further include a process kit shield 374 connected to a ledge 376 of the adapter 342. The adapter 342 in turn is sealed and grounded to the aluminum chamber sidewall 308. Generally, the process kit shield 374 extends downwardly along the walls of the adapter 342 and the chamber wall 308 downwardly to below an upper surface of the substrate support pedestal 302 and returns upwardly until reaching an upper surface of the substrate support pedestal 302 (e.g., forming a u-shaped portion 384 at the bottom). Alternatively, the bottommost portion of the process kit shield need not be a u-shaped portion 384 and may have any suitable shape. A cover ring 386 rests on the top of an upwardly extending lip 388 of the process kit shield 374 when the substrate support pedestal 302 is in its lower, loading position but rests on the outer periphery of the substrate support pedestal 302 when it is in its upper, deposition position to protect the substrate support pedestal 302 from sputter deposition. An additional deposition ring (not shown) may be used to shield the periphery of the substrate 304 from deposition. Embodiments of a process kit shield are discussed below in accordance with the present invention.

In some embodiments, a magnet 390 may be disposed about the chamber 200 for selectively providing a magnetic field between the substrate support pedestal 302 and the target 306. For example, as shown in FIG. 3, the magnet 390 may be disposed about the outside of the chamber wall 308 in a region just above the substrate support pedestal 302 when in processing position. In some embodiments, the magnet 390 may be disposed additionally or alternatively in other locations, such as adjacent the adapter 342. The magnet 390 may be an electromagnet and may be coupled to a power source (not shown) for controlling the magnitude of the magnetic field generated by the electromagnet.

A controller 310 may be provided and coupled to various components of the process chamber 300 to control the operation thereof. The controller 310 includes a central processing unit (CPU) 312, a memory 314, and support circuits 316. The controller 310 may control the process chamber 300 directly, or via computers (or controllers) associated with particular process chamber and/or support system components. The controller 310 may be one of any form of general-purpose computer processor that can be used in an industrial setting for controlling various chambers and sub-processors. The memory, or computer readable medium, 434 of the controller 310 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 316 are coupled to the CPU 312 for supporting the processor in a conventional manner. These circuits include cache, power supplies, clock circuits, input/output circuitry and subsystems, and the like. Inventive methods as described herein may be stored in the memory 314 as software routine that may be executed or invoked to control the operation of the process chamber 300 in the manner described herein. The software routine may also be stored and/or executed by a second CPU (not shown) that is remotely located from the hardware being controlled by the CPU 312.

In operation, a method for processing the substrate 304 may include applying a first RF power (for example, from the RF power source 318) at a VHF frequency to the target 306 comprising a metal disposed above the substrate to form a plasma from a plasma-forming gas. For example, the plasma-forming gas may be provided by the gas source 354. DC power, for example from the DC power source 320, can be applied to the target 306 to direct the plasma towards the target 306. While directing the plasma towards the target 306, the magnetron 100 may be rotated to provide benefits as discussed above, such as improved deposition uniformity and/or target lifetime and the like. Metal atoms from the target 306 are sputtered using the plasma while maintaining a first pressure in the chamber 300 sufficient to ionize a predominant portion of the metal atoms sputtered from the target 306. For example, the first pressure may be adequate to ensure that a substantial portion of the metal atoms sputtered from the target 306 interact with the plasma disposed between the target 306 and the substrate 304 such that the sputtered metal atoms become ionized. The ionized metal atoms can be deposited on the substrate 304 to form a layer thereon. For example, some embodiments of a layer may include depositing a layer in a high aspect ratio opening disposed in the substrate 304. For example, high aspect ratios may include a height: width of the opening ranging from about 5:1 to about 15:1, or greater than about 15:1. 20. In some embodiments, a second RF power (for example, from the RF bias power source 362) may be applied to the substrate 304 at least one of during or after depositing the ionized metal atoms on the substrate 304 to form the layer. For example, the second RF power may be utilized to direct ionized metal atoms towards a bottom surface of the opening and/or re-sputter deposited metal atoms to more completely for a layer on the surfaces of the opening.

Further, a plurality of substrates may be sequentially provided to the chamber 300 to form a layer on each substrate by the method described above. For example, the plurality of substrates may all be processed using the same target 306. The inventive design of the magnetron 100 may facilitate a sputtering distribution of metal atoms from the target 306 such that a initial profile of a initial layer formed on an initial substrate in the plurality of substrates is substantially equivalent to a final profile of a final layer formed on a final substrate in the plurality of substrates to be processed in the PVD chamber. Accordingly, the inventive magnetron 100 may allow for improved target wear such that the quality of each layer formed on each sequentially processed substrate is substantially similar. In some embodiments, the number of substrates in the plurality which may be processed prior to having to replace the target may range from about 5,000 to about 100,000 depending on thickness of layers being formed, and other factors which may accelerate target replacement.

Thus, methods and apparatus to improve target life and deposition uniformity in PVD chambers are provided herein. The inventive magnetron may advantageously increase target life, improve deposition uniformity, and provide required step coverage in an RF/DC PVD chamber.

While the foregoing is directed to embodiments of the present invention, other and further embodiments of the invention may be devised without departing from the basic scope thereof.

The invention claimed is:

1. A magnetron assembly, comprising:
 a shunt plate having a central axis, the shunt plate rotatable about the central axis;
 a first open loop magnetic pole arc coupled to the shunt plate at a first radius from the central axis; and
 a second open loop magnetic pole arc coupled to the shunt plate at a first distance from the first open loop magnetic pole arc, wherein the first distance varies along the second open loop magnetic pole arc.

2. The magnetron assembly of claim 1, wherein a first polarity of the first open loop magnetic pole arc opposes a second polarity of the second open loop magnetic pole arc.

3. The magnetron assembly of claim 1, wherein the first open loop magnetic pole arc further comprises:
 a first pole piece; and
 a plurality of first magnets disposed between the first pole piece and the shunt plate; and
 wherein the second open loop magnetic pole arc further comprises:
 a second pole piece; and
 a plurality of second magnets disposed between the second pole piece and the shunt plate.

4. The magnetron assembly of claim 1, wherein the first radius is constant along the first open loop magnetic pole arc.

5. The magnetron assembly of claim 1, wherein the first radius varies along the first open loop magnetic pole arc.

6. The magnetron assembly of claim 1, wherein the first open loop magnetic pole arc further comprises a plurality of first open loop magnetic pole arcs and the first radius further comprises a plurality of first radii and wherein the second open loop magnetic pole arc further comprises a plurality of second open loop magnetic pole arcs and the first distance further comprises a plurality of first distances.

7. The magnetron assembly of claim 6, wherein at least two first radii in the plurality of first radii are not equal and each first distance is equal.

8. The magnetron assembly of claim 6, wherein each first radius is equal and at least two first distances in the plurality of first distances are not equal.

9. The magnetron assembly of claim 6, wherein at least two first radii in the plurality of first radii are not equal and at least two first distances in the plurality of first distances are not equal.

10. The magnetron assembly of claim 6, wherein arc lengths of at least two first open loop magnetic pole arcs in the plurality of first open loop magnetic pole arcs are not equal.

11. The magnetron assembly of claim 6, wherein arc lengths of at least two second open loop magnetic pole arcs in the plurality of second open loop magnetic arcs are not equal.

12. The magnetron assembly of claim 1, further comprising:
 a third open loop magnetic pole arc coupled to the shunt plate and opposing the first and second open loop magnetic pole arcs, wherein the third open loop magnetic pole arc includes a third pole piece and a plurality of third magnets disposed between the third pole piece and the shunt plate.

13. The magnetron assembly of claim 12, further comprising:
 a linear stem open loop magnetic pole coupled to the shunt plate and extending from the third open loop magnetic pole arc towards the central axis of the shunt plate, wherein the linear stem open loop magnetic pole includes a linear pole piece and a plurality of fourth magnets disposed between the linear pole piece and the shunt plate.

14. The magnetron assembly of claim 13, further comprising:
 a plurality of counterweights disposed on opposing sides of the linear stem open loop magnetic pole.

15. A magnetron assembly, comprising:
 a shunt plate having a central axis, the shunt plate rotatable about the central axis;
 a first open loop magnetic pole arc coupled to the shunt plate at a first radius from the central axis and comprising a first pole piece and a plurality of first magnets disposed between the first pole piece and the shunt plate; and
 a second open loop magnetic pole arc coupled to the shunt plate at a first distance from the first open loop magnetic pole arc and comprising a second pole piece and a plurality of second magnets disposed between the second pole piece and the shunt plate, wherein a first polarity of the first open loop magnetic pole arc opposes a second polarity of the second open loop magnetic pole arc, and wherein the first distance varies along the second open loop magnetic pole arc.

* * * * *